(12) United States Patent
Choi

(10) Patent No.: US 10,115,366 B2
(45) Date of Patent: Oct. 30, 2018

(54) LIQUID CRYSTAL DISPLAY DEVICE FOR IMPROVING THE CHARACTERISTICS OF GATE DRIVE VOLTAGE

(71) Applicant: LG DISPLAY CO., LTD., Seoul (KR)

(72) Inventor: Joung Mi Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 105 days.

(21) Appl. No.: 14/818,104

(22) Filed: Aug. 4, 2015

(65) Prior Publication Data

US 2015/0340003 A1 Nov. 26, 2015

Related U.S. Application Data

(62) Division of application No. 13/727,323, filed on Dec. 26, 2012, now Pat. No. 9,123,310.

(30) Foreign Application Priority Data

Sep. 28, 2012 (KR) .................. 10-2012-0109249

(51) Int. Cl.
*G09G 3/36* (2006.01)
*G11C 19/28* (2006.01)

(52) U.S. Cl.
CPC ......... *G09G 3/3696* (2013.01); *G09G 3/3655* (2013.01); *G09G 3/3659* (2013.01); *G09G 3/3677* (2013.01); *G09G 3/3688* (2013.01); *G11C 19/287* (2013.01); *G09G 2310/0251* (2013.01); *G09G 2310/0286* (2013.01); *G09G 2320/02* (2013.01)

(58) Field of Classification Search
CPC ... G09G 2310/0286; G09G 2310/0289; G09G 3/3674; G09G 3/3677; G09G 3/3681
See application file for complete search history.

(56) References Cited

U.S. PATENT DOCUMENTS 7,656,004 B2 2/2010 Jeon et al.
8,531,224 B2 9/2013 Iwamoto
(Continued)

FOREIGN PATENT DOCUMENTS

JP 10-253940 A 9/1998
JP 2004-334216 A 11/2004
(Continued)

*Primary Examiner* — Hang Lin
(74) *Attorney, Agent, or Firm* — Birch, Stewart, Kolasch & Birch, LLP

(57) ABSTRACT

An LCD device can include a liquid crystal display panel having a plurality of gate lines; a controller configured to generate at least four clock signals with different phases; a first gate driver configured to apply a high gate voltage to odd-numbered gate lines in response to at least two of the clock signals; a second gate driver configured to apply the high gate voltage to even-numbered gate lines in response to other clock signals; primary discharge circuits each configured to apply a low gate voltage to the respective odd-numbered gate line in response to a carry signal opposite to a voltage level on one of posterior odd-and-even-numbered gate lines; and secondary discharge circuits each configured to apply the low gate voltage to the respective even-numbered gate line in response to the carry signal opposite to the voltage level on the other one of the posterior odd-and-even-numbered gate lines.

6 Claims, 8 Drawing Sheets

(56) References Cited

U.S. PATENT DOCUMENTS

| | | | |
|---|---|---|---|
| 2005/0008114 A1* | 1/2005 | Moon | G09G 3/3677 377/64 |
| 2005/0030254 A1 | 2/2005 | Jung et al. | |
| 2006/0145998 A1* | 7/2006 | Cho | G09G 3/3677 345/100 |
| 2006/0227094 A1 | 10/2006 | Park et al. | |
| 2006/0279511 A1* | 12/2006 | Uh | G11C 19/184 345/100 |
| 2007/0164954 A1 | 7/2007 | Yang et al. | |
| 2008/0278214 A1* | 11/2008 | Yoon | G09G 3/3677 327/379 |
| 2010/0315403 A1 | 12/2010 | Kaneyoshi et al. | |
| 2011/0002438 A1 | 1/2011 | Kim | |
| 2011/0069044 A1 | 3/2011 | Lee et al. | |
| 2011/0157263 A1 | 6/2011 | Kim et al. | |
| 2012/0013588 A1 | 1/2012 | Chung | |

FOREIGN PATENT DOCUMENTS

| | | |
|---|---|---|
| JP | 2011-065740 A1 | 3/2011 |
| JP | 2011-138100 A | 7/2011 |
| WO | WO 2009/104322 A1 | 8/2009 |
| WO | WO 2011/055569 A1 | 5/2011 |

* cited by examiner

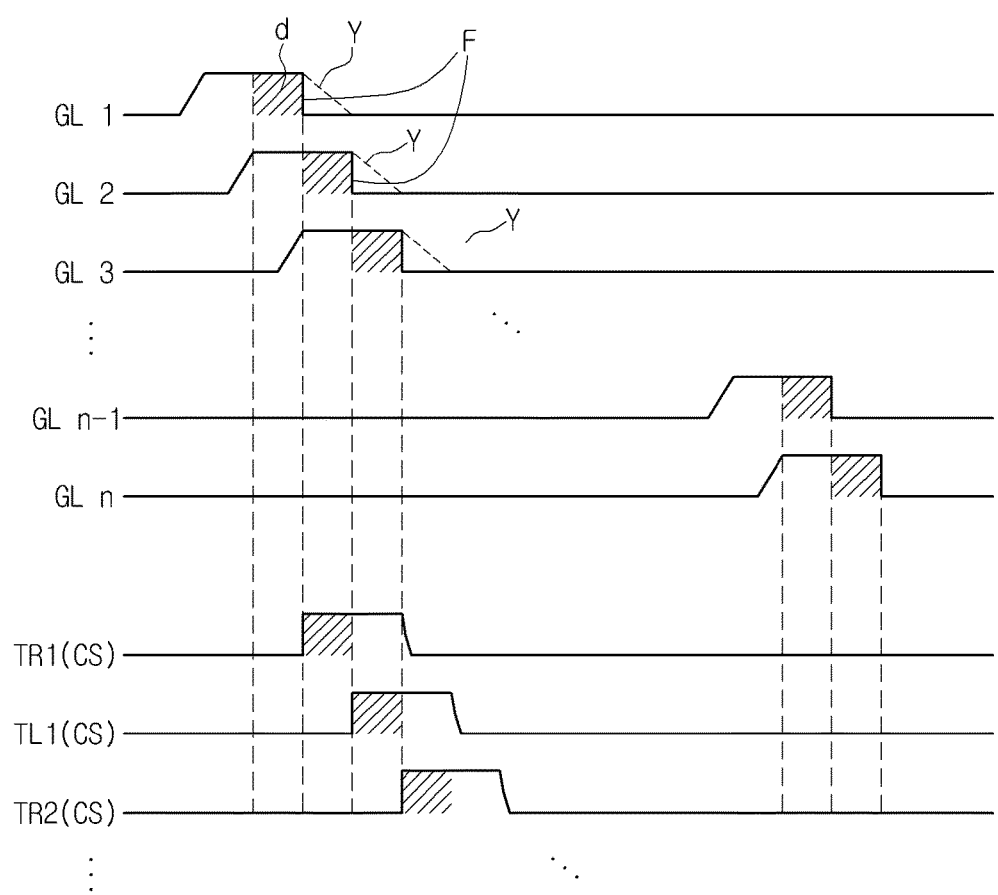

LIQUID CRYSTAL DISPLAY DEVICE FOR IMPROVING THE CHARACTERISTICS OF GATE DRIVE VOLTAGE

CROSS REFERENCE TO RELATED APPLICATIONS

This application is a Divisional of co-pending U.S. patent application Ser. No. 13/727,323 filed on Dec. 26, 2012, which claims priority under 35 U.S.C. § 119(a) of Korean Patent Application No. 10-2012-0109249 filed on Sep. 28, 2012, which are all hereby incorporated by reference in their entirety.

BACKGROUND OF THE INVENTION

Field of the Disclosure

The present application relates to a liquid crystal display device, and more particularly to a liquid crystal display device adapted to improve the characteristics of gate drive voltages applied to gate lines.

Discussion of the Related Art

In an electrical information display device field, existing cathode ray tubes (CRTs) are being replaced with flat panel display devices. The flat panel display devices include liquid crystal display (LCD) devices, plasma display panels (PDPs), field emission display (FFD) devices, organic light-emitting display (OLED) devices and so on. Among the display devices, the LCD devices are being mainly used at present because of having features such as mass production technologies, an easy driver, high picture quality and a large-sized screen.

In the LCD devices, an active matrix LCD device using thin film transistors as switch elements is suitable to display moving images. In order to control the above-mentioned thin film transistor to be turned-on/off, an ordinary LCD device includes a gate driver configured to generate and apply scan signals. Also, the ordinary LCD device further includes a data driver configured to provide data signals which are used to display gray levels of an image.

FIG. 1 is a block diagram schematically showing the configuration of an LCD device according to the related art.

As shown in FIG. 1, the related art LCD device 10 includes an LCD panel 1 displaying images and drivers 4 and 5.

The LCD panel 1 includes a plurality of gate lines GL and a plurality of data lines DL which cross each other and are formed on a glass substrate. A plurality of pixels arranged in a matrix shape are defined by the gate lines GL and the data lines DL crossing each other. An image is displayed on the LCD panel 1 by data signals applied to the pixels. Such an LCD panel 1 is defined a display area A/A, in which the pixels used to display an image are formed, and a non-display area N/A surrounding the display area A/A.

The drivers 4 and 5 include a gate driver 4 and a data driver 5. The gate driver 4 replies to gate control signals GCS applied from a timing controller (not shown) and controls switch elements of the pixels arranged on the LCD panel 1 to be turned-on/off. In detail, the gate driver 4 applies gate drive voltages VG to the LCD panel 1 via the gate lines DL and enables the switch elements of the pixels to be sequentially turned-on in a single line. As such, the pixels receive data signals which are applied from the data driver 5 in every horizontal synchronous period.

The data driver 5 replies to data control signals DCS applied from the timing controller and converts digital image data into analog data signals. A single line of data signals are simultaneously applied from the data driver 5 to the LCD panel via the data lines DL in every horizontal synchronous period. In accordance therewith, the pixels display the gray levels of an image.

In such configuration of the LCD device 10, the gate driver 4 has a feature that its configuration is relatively simpler compared to the data driver 5. Also, the LCD device has been required to reduce weight, volume and manufacturing costs. In view of these points, a gate-in-panel (GIP) gate driver has been proposed. The GIP gate driver is formed on the non-display area of the LCD together with the thin film transistors on the display area A/A at the manufacture of an array substrate of the LCD panel, unlike an ordinary gate driver which is manufactured in a separate IC (Integrated Circuit) chip from the LCD panel and bonded to the LCD panel.

Meanwhile, the LCD device causes motion blur phenomena due to a critical response speed of liquid crystal. Due to this, image quality of the LCD device must deteriorate. To address this matter, an LCD device is proposed which is driven in a higher frequency mode of above 120 Hz compared to 60 Hz. If the LCD device is driven in a high frequency range of above 120 Hz, a single horizontal synchronous cycle (or period) must be shortened. As such, it is difficult to secure the turning-on time of a switch element within each pixel.

To this end, the recent LCD device enables not only a gate driver 4 to include first and second gate drivers 4a and 4b which are disposed on left and right edges of an LCD panel in a GIP mode, but also gate lines to be pre-charged by providing an overlap interval between gate drive voltages on the gate lines. As such, the switch element within each pixel can be stably turned-on.

However, although the overlay interval is provided between the gate drive voltages on the gate lines or the driving frequency becomes higher, it is difficult to increase a discharge speed of the gate drive voltage charged in each gate line.

SUMMARY OF THE INVENTION

Accordingly, embodiments of the present application are directed to an LCD device that substantially obviates one or more of problems due to the limitations and disadvantages of the related art.

The embodiments are to provide an LCD device that is adapted to enhance image quality by disposing a discharge circuit cm each gate line and rapidly discharging a gate drive voltage charged in each gate line.

Also, the embodiments are to provide an LCD device that is adapted to prevent a discharge delay of a gate drive voltage by enabling the gate drive voltage and a carry signal for controlling a discharge circuit disposed on a anterior gate line to be independently output from each stage within a gate driver on a dual GIP mode LCD panel.

Furthermore, the embodiments are to provide an LCD device that is adapted to minimize the occupying area of a gate driver by reducing the number of stages using a configuration of two gate drivers which perform for gate drive voltages an alternate output instead of a simultaneous output.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to an general aspect of the present embodiment, an LCD device includes: a liquid crystal display panel in which n gate lines are formed, the n being a natural number; a timing controller configured to generate first to sixth clock signals using timing control signals applied from an external system; a first gate driver configured to apply a high gate voltage to one ends of the (2k−1)th gate lines in response to the first, third and fifth clock signals, the "k" being a natural number smaller than the "n"; a second gate driver configured to apply the high gate voltage to one ends of the (2k)th gate lines in response to the second, fourth and sixth clock signals; left discharge circuits each configured to a low gate voltage to the other end of the (2k−1)th gate line according to a voltage level on (2k+1)th gate line; and right discharge circuits each configured to the low gate voltage to the other end of the (2k)th gate line according to the voltage level on (2k+2)th gate line, wherein the first gate driver includes a plurality of left stages which each include a gate output terminal used to output the high gate voltage and a carry output terminal used to control the respective left discharge circuit, and the second gate driver includes a plurality of right stages which each include another gate output terminal used to output the high gate voltage and another carry output terminal used configured to control the respective right discharge circuit.

An LCD device according to another general aspect of the present embodiment includes: a liquid crystal display panel in which a plurality of gate lines are formed; a controller configured to generate at least four clock signals with difference phases; a first gate driver configured to apply a high gate voltage to odd-numbered gate lines in response to at least two of the clock signals from the controller; a second gate driver configured to apply the high gate voltage to even-numbered gate lines in response to the others of the clock signals from the controller; primary discharge circuits each configured to a low gate voltage to the respective odd numbered gate line in response to a carry signal opposite to a voltage level on one of posterior odd-and-even-numbered gate lines; and secondary discharge circuits each configured to the low gate voltage to the respective even-numbered gate line in response to the carry signal opposite to the voltage level on the other one of the posterior odd-and-even-numbered gate lines, wherein the first gate driver includes a plurality of primary stages which each include a gate output portion used to output the high gate voltage to the respective odd-numbered gate line and a carry output portion used to output the carry signal to the discharge circuit connected to one of anterior odd-and-even-numbered gate lines, and the second gate driver includes a plurality of secondary stages which each include another gate output portion used to output the high gate voltage to the respective even-numbered gate line and another carry output portion used to output the carry signal to the discharge circuit connected to the other one of the anterior odd-and-even-numbered gate lines.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings:

FIG. 9 is a waveform diagram illustrating variations of gate drive voltages, which are applied to gate lines on an LCD panel, in accordance with a second embodiment of the present disclosure.

DETAILED DESCRIPTION OF THE INVENTION

Figure 1:
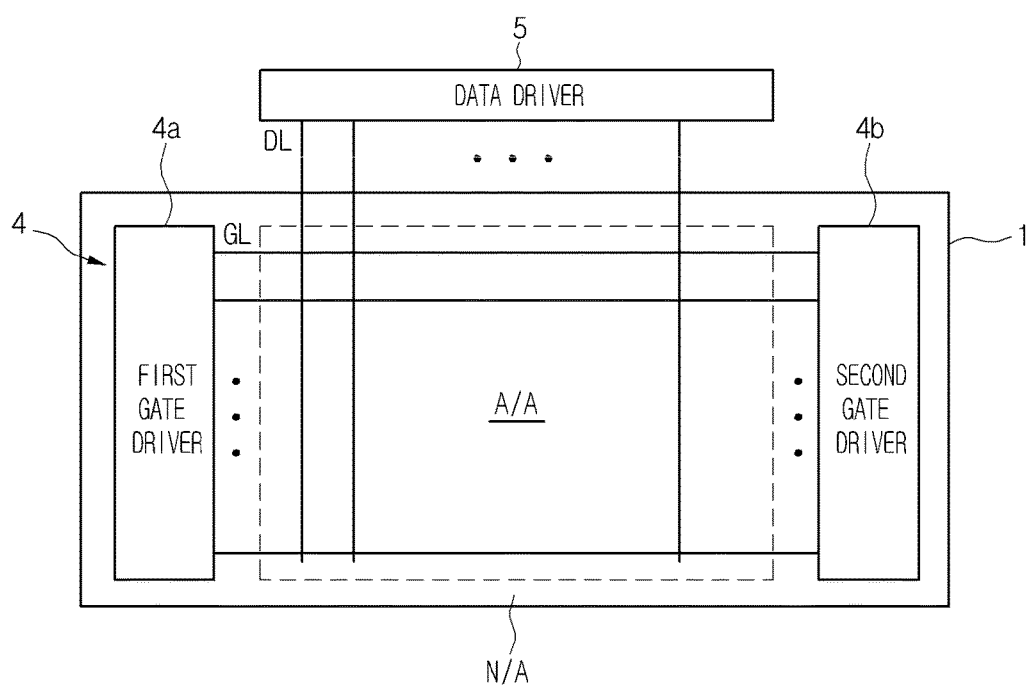
FIG. 1 is a block diagram schematically showing the configuration of an LCD device according to the related art.

Reference will now be made in detail to the embodiments of the present disclosure, examples of which are illustrated in the accompanying drawings. These embodiments introduced hereinafter e provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

Figure 2:
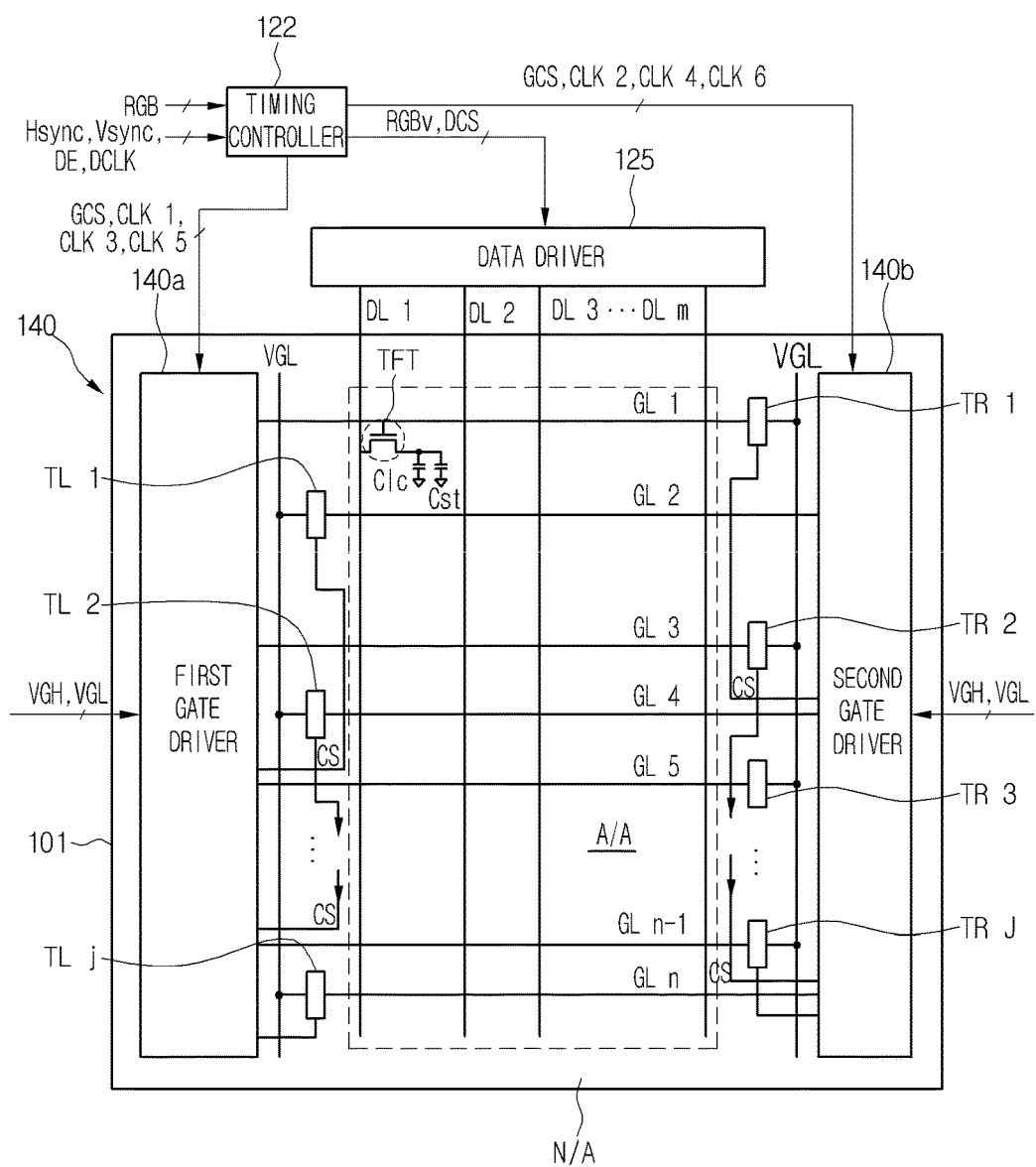
FIG. 2 is a block diagram showing an LCD device according to a first embodiment of the present disclosure.

FIG. 2 is a block diagram showing an LCD device according to a first embodiment of the present disclosure.

As shown in FIG. 2, the LCD device 100 according to a first embodiment of the present disclosure uses six phase clock signals CLK1~CLK6 in order to provide a more stable operation compared to a 120 Hz drive mode.

The LCD device 100 according to a first embodiment of the present disclosure includes an LCD panel 101, a timing controller 122 configured to generate a variety of control signals using timing signals applied from external system, and gate and data drivers 140 and 125 configured to control the LCD panel 101 in response to the control signals.

The LCD panel 101 includes a plurality of gate lines GL and a plurality of data lines DL formed on a glass substrate. A plurality of pixels arranged in a matrix shape is defined by the gate and data lines GL and DL crossing each other. Each pixel includes a thin film transistor TFT, a liquid crystal cell Clc and a storage capacitor CA. The LCD panel 101 is defined into a display area A/A, in which the plurality of pixels is formed, and a non-display area N/A in which any pixel is not formed.

The timing controller 122 receives image data RGB and timing signals from the external system. The timing controller 122 derives the control signals from the timing signals. The control signals are used to control the gate driver 140 and the data driver 125. The timing signals includes a data clock signal DCLK, a horizontal synchronous signal Hsync, a vertical synchronous signal Vsync, a data enable signal DE and so on.

The horizontal synchronous signal Hsync indicates the time required to display a single horizontal line image. The vertical synchronous signal Vsync indicates the time required to display a single frame image. The data enable signal DE indicates an interval that data voltages are applied, to the pixels defined on the LCD panel 101.

The control signals generated in the timing controller 122 include gate control signals GCS and data control signals DCS which are synchronized with the timing signals. The gate control signals GCS are used to control the gate driver 140 and the data control signals DCS are used to control the data driver 125. The gate control signals GCS generated in the timing controller 122 include a plurality of clock signals, for example, first through sixth clock signals CLK1~CLK6 used to determine a driving timing of each stage within the gate driver 140. The first through sixth clock signals CLK1~CLK6 each have a high level interval (or width) corresponding to three horizontal synchronous cycles (or periods). The high level intervals (or widths) of first through sixth clock signals CLK1~CLK6 overlap with one another by the period of two horizontal synchronous cycles. The first, third and fifth clock signals CLK1, CLK3 and CLK5 are applied, to a first gate driver 140a. The second, fourth and sixth clock signals CLK2, CLK4 and CLK6 are applied to a second gate driver 140b.

Also, the timing controller 122 re-arranges and modifies the received image data RGB in a format required by the data driver 125. The re-formatted image data RGBv is applied from the timing controller 122 to the data driver 125. Also, the re-formatted image data RGBv can be obtained using a chromaticity correction algorithm, in order to enhance image quality.

The gate driver 140 includes the first and second gate drivers 140a and 140b which are disposed on both edges of the LCD panel 101 corresponding to the non-display area N/A. The first and second gate drivers 140a and 140b each include a shift register which consists of a plurality of stages. Such a gate driver 140 is formed on the non-display area N/A of the LCD panel 101 in such a manner as to have thin film patterns when the LCD panel 101 is manufactured. In other words, the gate driver 140 is mounted on the LCD panel 101 in a GIP system.

The first and second gate drivers 140a and 140b included in the gate driver 140 reply to the gate control signals GCS applied from the timing controller 122 and perform alternately with each other the output operation of a gate drive voltage every single horizontal synchronous cycle, so that the gate drive voltages are sequentially applied to the plurality of gate lines GL1~GLn on the LCD panel 101 in a single horizontal synchronous cycle. The gate drive voltage applied to each gate line GL maintains a high gate voltage VGH during the period of three horizontal synchronous cycles. Also, the high gate voltage interval (or width) of the gate drive voltage on each gate line overlaps with those of the gate drive voltage applied the previous and next gate lines GL adjacent to the respective gate line by the period of two horizontal synchronous cycles. This results in pre-charging of the gate lines GL1~GLn. As such, the pixel can perform a more stable charging operation when the data voltage is applied.

To this end, the first, third and fifth clock signals CLK1, CLK3 and CLK5 each having a pulse width corresponding three horizontal synchronous cycles (i.e., a period corresponding to six horizontal synchronous cycles) are applied to the first gate driver 14a. Also, the second, fourth and sixth clock signals CLK2, CLK4 and CLK6 having the same width as the first, third and fifth clock signals CLK1, CLK3 and CLK5 are applied to the second gate driver 140b. The second, fourth and sixth clock signals CLK2, CLK4 and CLK6 overlap with the first, third and fifth clock signals CLK1, CLK3 and CLK5 by the period corresponding to two horizontal synchronous cycles, respectively.

For example, the high gate voltage VGH is applied from the second gate driver 140b to the (k+1)th gate line GLk+1 after the period of a single horizontal cycle from when the high gate voltage VGH is applied from the first gate driver 140a to the kth gate line GLk. The high gate voltage VGH is applied from the first gate driver 140a to the (k+2)th gate line GLk+2 after the period of a single horizontal cycle from when the high gate voltage VGH is applied from the second gate driver 140b to the (k+1)th gate line GLk+1.

After the period of a single horizontal synchronous cycle from when the high gate voltage VGH is applied from the first gate driver 140a to the (k+2)th gate line GLk+2, not only the high gate voltage VGH is applied from the second gate driver 140b to the (k+3)th gate line GLk+3 but also the low gate voltage VGL is applied from the second gate driver 140b to the kth gate line GLk. As such, the thin film transistors TFT on the kth gate line GLk are turned-off and allow the data voltages charged into the liquid crystal cell Clc to be maintained during a single frame period. Wherein "k" is a natural number smaller than "n".

Also, the LCD device 100 further includes discharge circuits TL1~TLj and TR1~TRj disposed on the respective gate lines GL1~GLn and configured to minimize a discharge delay of the gate drive voltage. To this end, each of the discharge circuits TL1~TLj and TR1~TRJ enables the low gate voltage VGL to be applied to the respective gate line GL without any delay when the voltage on the respective gate line GL transitions from the high gate voltage VGH into the low gate voltage VGL.

For example, when the voltage on the nth gate line GLn transitions from the high gate voltage VGH into the low gate voltage VGL, the jth left discharge circuit TLj for applying the low gate voltage VGL is activated and enables the voltage on the nth gate line GLn to be discharged. In accordance therewith, the discharge delay on the nth gate line GLn can be minimized.

Each of the discharge circuits is connected to one end of the respective gate line GL. In detail, right discharge circuits TR1~TRj arranged adjacently to the second gate driver 140b are connected to one ends of odd-numbered gate lines GL1, GL3, ..., GLn−1, and left discharge circuits TL1~TLj arranged adjacently to the first gate driver 140a are connected to the other ends of even-numbered gate lines GL2, GL4, ..., GLn. Wherein "j" is a natural number smaller than "n".

Each of the discharge circuits is activated by a carry signal applied from a stage which is connected with the next third gate line GLk−1 to the respective gate line GLk. For example, the first right discharge circuit TR1 connected to the first gate line GL1 is activated by the carry signal applied from a stage which is connected to the fourth gate line GL4. To this end, the stages included in the gate driver 140 of the present embodiment each output the gate drive voltage and the carry signal for activating the respective discharge circuit TL1~TLj and TR1~TRj, unlike those of the related art gate driver.

In this manner, each of the discharge circuits TL1~TLj and TR1~TRj is activated and enables the low gate voltage VGL to be applied to the respective gate line GL. Also, the discharge circuits can be implemented by thin film transistors each disposed between the stages which form the gate driver 140. In accordance therewith, the occupying area of the first and second gate drivers 140a and 140b within the non-display area of the LCD panel 101 can be reduced.

Such stage and discharge circuit of the gate driver 140 will be described in detail later.

The data driver 125 replies to the data control signals DCS applied from the timing controller 122 and converts the re-formatted digital image data RGBv into analog data voltages VDATA selectively using reference voltages Vref. The data voltages VDATA are generated by a single horizontal line of pixels. Also, the data voltages VDATA are simultaneously applied to the LCD panel 101 via the data lines DL1~DLm during a single horizontal synchronous period.

As described above, the LCD device with an integrated driver circuit according to a first embodiment of the present disclosure allows the two gate drivers to output alternately with each other the gate drive voltages without simultaneously outputting the gate drive voltages. As such, the number of stages included in the gate drivers can be reduced.

Moreover, the discharge circuits are additionally disposed between the stages and enable the voltage discharge from the gate line to be promoted. Therefore, the discharging delay of the voltage on the gate line can be minimized.

The configuration of the gate driver and the discharge circuits according to a first embodiment of the present disclosure will now be explained in detail with reference to the accompanying drawings.

Figure 3:
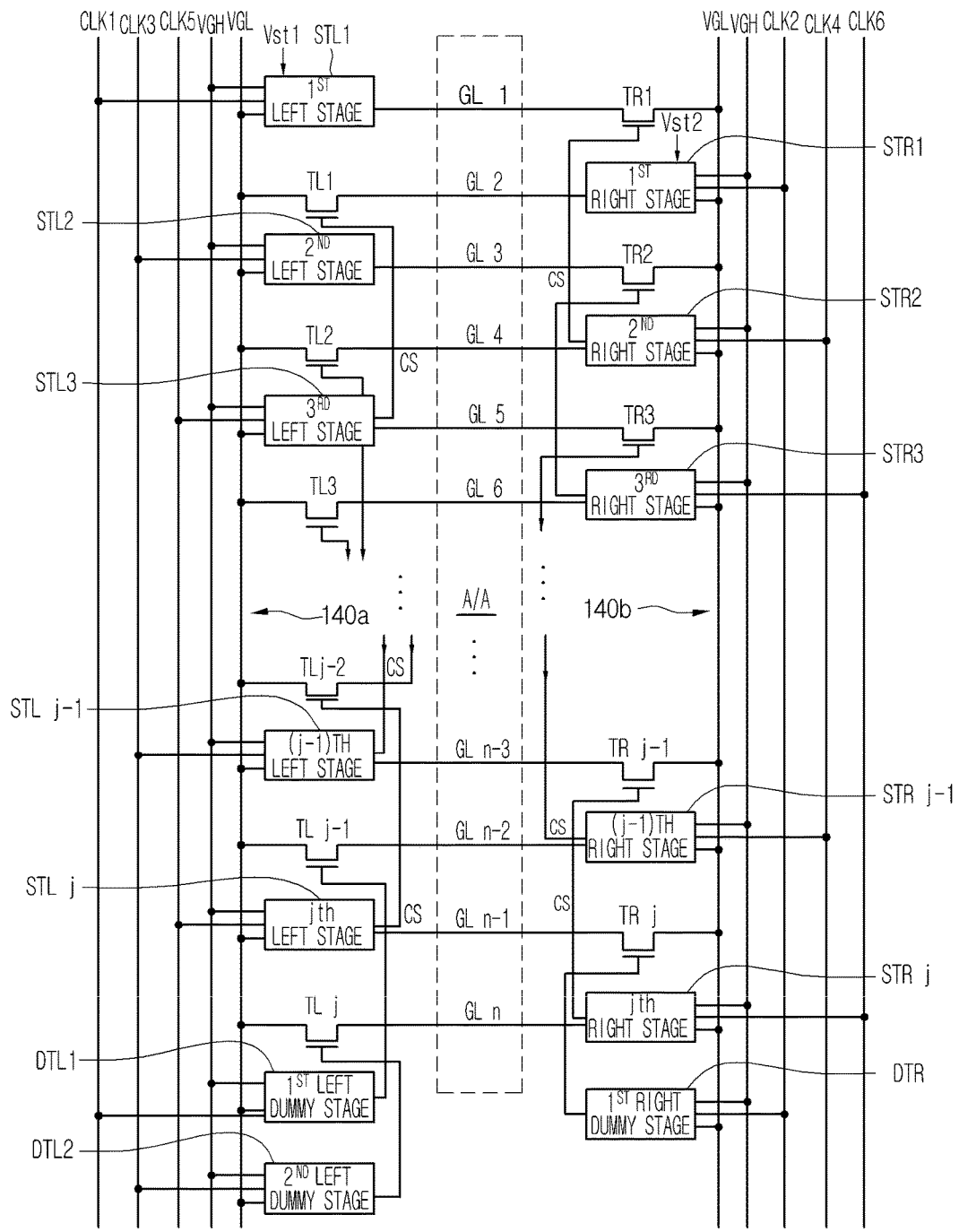
FIG. 3 is a detailed circuit diagram showing the configuration of a gate driver, which includes discharge circuits and is formed on an LCD panel, according to a first embodiment of the present disclosure.

FIG. 3 is a detailed circuit diagram showing the configuration of a gate drivers and discharge circuits, which are formed on an LCD panel, according to a first embodiment of the present disclosure.

Referring to FIG. 3, the gate driver according to a first embodiment of the present disclosure includes the first gate driver 140a formed on one edge of the LCD panel 101 and the second gate driver 140b formed another edge opposite to one edge. Meanwhile, each of the discharge circuits can be implemented by a single discharge transistor. As such, the gate driver further includes a plurality of left discharge transistor TL1~TLj disposed between the stages of the first gate driver 140a and a plurality of right discharge transistors TR1~TRj disposed between stages of the second gate driver 140b.

The stages can be driven in a six phase mode. To this end, first through sixth clock signals CLK1~CLK6 with six phases different from one another, a high gate voltage VGH, a carry signal CS generated in other stage and a low gate voltage VGL are applied to the stages. Although they are not shown in the drawings, a power supply voltage VDD and a ground voltage GND can be applied to the stages. The first through sixth clock signals CLK1~CLK6 each have a high level interval (or width) corresponding to three horizontal synchronous cycles. The high level intervals (or widths) of the first through sixth clock signals CLK1~CLK6 overlap with one another by the period of two horizontal synchronous cycles. The high gate voltage VGH is used to turn-on the thin film transistors within the display area A/A. The carry signal CS is directly output from a stage and used to control the discharge circuit. The low gate voltage VGL is used to turn-off the thin film transistors within the display area A/A.

Also, the stages within the gate driver 140 of the present embodiment each include a gate output terminal configured to output a gate drive voltage (i.e., the high gate voltage pulse) and a carry output terminal configured to output a carry signal which will be applied to a discharge circuit connected to an adjacent gate line, unlike those of the related art gate driver. Such a stage included in the gate driver 140 of the present embodiment will be explained in detail through the description of FIGS. 4A and 4B.

More specifically, the first gate driver 140a receives the first, third and fifth clock, signals CLK1, CLK3 and CLK5, the high gate voltage VGH, the carry signal CS and the low gate voltage VGL. The first gate driver 140a replies to a first start voltage Vst1 corresponding to a gate start pulse GSP and sequentially outputs the gate drive voltages to a plurality of odd-numbered gate lines GL1, GL3, ..., GLn−1 in the period of two horizontal synchronous cycles. The gate drive voltages each have a high gate voltage pulse which is used to turn-on the thin film transistors within the display area A/A and has a width corresponding to three horizontal synchronous cycles. The high gate voltage pulse applied to each gate line overlaps with the high gate voltage pulses, which are applied to the previous and next gate lines adjacent to the respective gate line, by the period of two horizontal synchronous cycles.

Such a first gate driver 140a includes first through jth left stages STL1~STLj and two left dummy stages DTL1 and DTL2 which are serially connected to one another based on the first start voltage Vst1.

The second gate driver 140b receives the second, fourth and sixth clock signals CLK2, CLK4 and CLK6, the high gate voltage VGH, the carry signal CS and the low gate voltage VGL. The second gate driver 140b replies to a second start voltage Vst2 corresponding to the gate start pulse GSP and sequentially outputs the gate drive voltages to a plurality of even-numbered gate lines GL2, GL4, ..., GLn in the period of two horizontal synchronous cycles. The gate drive voltages on the even-numbered gate lines GL2, GL4, ..., GLn have the similar high gate voltage pulses to those on the odd-numbered gate lines GL1, GL3, ..., GLn−1.

This second gate driver 140b includes first through jth right stages STR1~STRj and a right dummy stage DTR which are serially connected to one another based on the second start voltage Vst2.

Also, the gate driver 140 includes left discharge transistors TL1~TLj disposed between the left stages which include the first through jth left stages STL1~STLj and the two left dummy stages DTL1 and DTL2.

Meanwhile, the jth left state STLj connected to the (n−1)th gate line GLn−1 can be used to drive the (j−2)th left discharge transistor TLj−2 and the jth right state STRj connected to the nth gate line GLn can be used to drive the (j−1)th right discharge transistor TRj−1. Due to this, the first and second left dummy stages DTL1 and DTL2 and the right dummy stage DTR are provided, in order to drive the (j−1)th and jth left discharge transistors TLj−1 and TLj, which are connected to the (n−2)th and nth gate lines GLn−2 and GLn, and the jth right discharge transistor TRj connected to the (n−1)th gate line GLn−1.

A first electrode of each left discharge transistor TL1~TLj is connected to the even-numbered gate line GL2, GL4, . . . , GLn to which the gate output terminal of each of the right stage STR1~STRj and the right dummy stages is connected. A gate electrode of each left discharge transistor TL1~TLj is connected to the carry output terminal of either the posterior left state to the right stage STR which is connected to the first electrode, or one of the left dummy stages DTL1 and DTL2. A second electrode of each left discharge transistor TL1~TLj is connected to a low gate voltage line used to transfer the low gate voltage VGL.

For example, the first electrode of the first left discharge transistor TL1 is connected to the second gate line GL2, and the gate electrode of the first left discharge transistor TL1 is connected to the carry output terminal of the third left stage STL3 connected to the fifth gate line GL5. Also, the second electrode of the first left discharge transistor TL1 is connected to the low gate voltage line.

The gate driver 140 further includes right discharge transistors TR1~TRj disposed between the right stages which include the first through jth right stages STR1~STRj and the right dummy stage DTR.

A first electrode of each right discharge transistor TR1~TRj is connected to the odd-numbered gate line GL1, GL3, . . . , GLn to which the gate output terminal of each left stage STL1~STLj is connected. A gate electrode of each right discharge transistor TR1~TRj is connected to the carry output terminal of either the posterior right state to the left stage STL which is connected to the first electrode, or the right dummy stage DTR. A second electrode of each right discharge transistor TR1~TRj is connected to a low gate voltage line used to transfer the low gate voltage VGL.

For example, the first electrode of the first right discharge transistor TR1 is connected to the first gate line GL1, and the gate electrode of the first right discharge transistor TR1 is connected to the carry output terminal of the second right stage STR2 connected to the fourth gate line GL4. Also, the second electrode of the first right discharge transistor TR1 is connected to the low gate voltage line.

The above-mentioned six-phase mode gate driver including the discharge circuits will now be explained in detail.

When the first and second start voltages Vst1 and Vst2 are applied to the first and second gate drivers 140*a* and 140*b*, first, the first left stage STL1 of the first gate driver 140*a* replies to the first clock signal CLK1 and outputs the high gate voltage VGH to the first gate line GL1 during the period of three horizontal synchronous cycles. In other words, the first left stage STL1 of the first gate driver 140*a* outputs the high gate voltage pulse with the width of three horizontal synchronous cycles the first gate line GL1.

Thereafter, the first right stage STR1 of the second gate driver 140*b* responsive to the second clock signal CLK2 outputs the high gate voltage VGH to the second gate line GL2 through the gate output terminal during the period of three horizontal synchronous cycles. In other words, the first right stage STR1 of the second gate driver 140*b* outputs the high gate voltage pulse with the width of three horizontal synchronous cycles the second gate line GL2.

The first and second clock signals CLK1 and CLK2 overlap with each other by the period of two horizontal synchronous cycles. The second clock signal CLK2 has a delayed phase of a single horizontal synchronous cycle from the first clock signal CLK1. As such, the posterior portion of the high gate voltage pulse on the first gate line GL1 overlaps with the anterior portion of the high gate voltage pulse on the second gate line GL2 by the period of two horizontal synchronous cycles.

Subsequently, the second left stage STL2 responsive to the third clock signal CLK3 outputs the high gate voltage pulse with the width of three horizontal synchronous cycles to the third gate line GL3. Afterward, the second right stage STR2 responsive to the fourth clock signal CLK4 outputs the high gate voltage pulse with the width of three horizontal synchronous cycles the fourth gate line GL4.

The above-mentioned high gate voltage pulses are gate drive voltages being output from the gate output terminals of the respective stages. Each stage of the present embodiment includes the gate output terminal and the carry output terminal which are separated from each other. As such, each stage enables not only the high gate voltage pulse to be output from the gate output terminal but also the carry signal CS to be output from the carry output terminal. Also, the carry signal, which is generated in the stage connected to kth gate line GLk, is used to control the discharge circuit connected to the (k−3)th gate line GLk−3.

When the first left stage STL1 responsive to the first clock signal CLK1 outputs the low gate voltage VGL to the first gate line GL1, the carry signal CS generated in the second right stage STR2 is simultaneously applied to the gate electrode of the first right discharge transistor TR1 connected to one end of the first gate line GL1. As such, the first right discharge transistor TR1 is turned-on by the carry signal CS of the second right stage STR2. Also, the first gate line GL1 can be connected to the low gate voltage line via the first and second electrodes of the first right discharge transistor TR1. In accordance therewith, the voltage on the first gate line GL1 can rapidly transition from the high gate voltage VGH into the low gate voltage VGL.

In other words, both ends of the first gate line GL1 can simultaneously receive the low gate voltage VGL. As such, the delay of a signal caused by a line resistance can be minimized. Therefore, the turned-on first right discharge transistor TR1 (i.e., a discharge circuit) enables the high gate voltage on the first gate line GL1 to be rapidly discharged.

Moreover, in order to minimize the delay time when the gate drive voltage transitions from the high gate voltage VGH to the low gate voltage VGL, each stage of the present embodiment enables the carry signal CS to be directly applied from the carry output terminal to the gate electrode of the respective discharge transistor.

In general, each stage of the related art controls the discharge circuit using the gate drive voltage (i.e., the high gate voltage VGH). In other words, each stage of the related art simultaneously applies the gate high voltage VGH not only the gate line but also the discharge circuit. As such, the load of each stage according to the related, art must be large. Also, the delay time of the high gate voltage VGH used not only to turn-on the discharge transistor of the discharge circuit but also to drive the gate line must lengthen. Meanwhile, each stage of the present embodiment uses the carry signal CS in the control of the discharge circuit without being connected any different load. Therefore, each stage of the present embodiment can allow the high gate voltage on the gate line to be rapidly discharged.

Figure 4A:
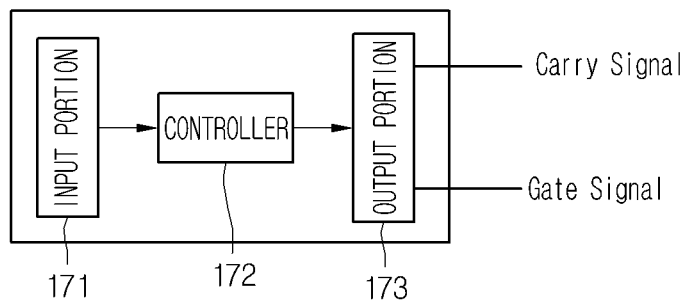
FIG. 4A is a detailed block diagram showing the configuration of a stage which is disposed in the gate driver of an LCD device, according to a first embodiment of the present disclosure.
Figure 4B:
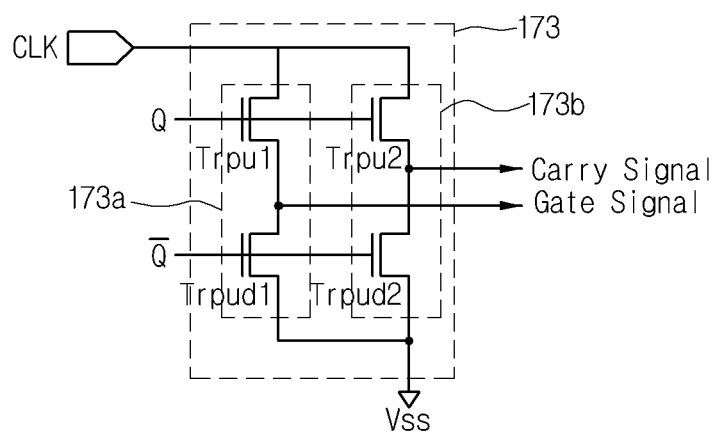
FIG. 4B is a detailed circuit diagram showing the configuration of an output portion within a stage of FIG. 4A.
Figure 5:
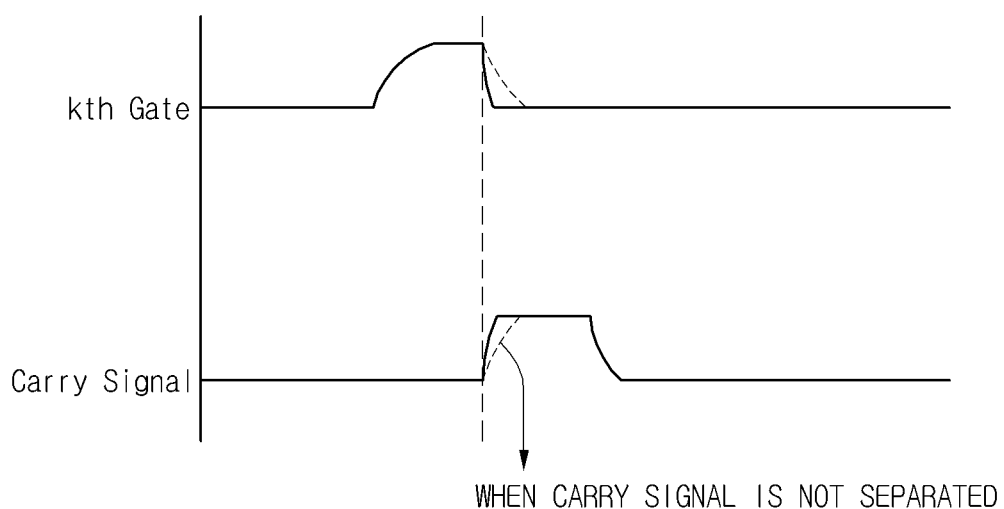
FIG. 5 is a waveform diagram comparing a gate drive voltage and a carry signal, which are output from nth stage of the gate driver, in accordance with a first embodiment of the present disclosure.

FIG. 4A is a detailed block diagram showing the configuration of a stage which is disposed in the gate driver of an LCD device, according to a first embodiment of the present disclosure. FIG. 4B is a detailed circuit diagram showing the configuration of an output portion within a stage of FIG. 4A. FIG. 5 is a waveform diagram comparing a gate drive voltage and a carry signal, which are output from nth stage of the gate driver, in accordance with a first embodiment of the present disclosure.

As shown in the drawings, the stage included in the gate driver of the present embodiment includes an input portion 171, a controller 172 and an output portion 173. The input portion 171 receives a clock signal CLK, the high gate voltage VGH, the low gate voltage VGL and so on as input signals. The controller 172 generates control signals for controlling the output portion 173, using the input signals from the input portion 171. The output portion 173 outputs the high gate voltage VGH and the carry signal using the clock signal and the control signals.

The output portion 173 of the stage according to the present embodiment includes a gate output portion 173a and a carry output portion 173b. The gate output portion 173a can include a first pull-up transistor Trpu1 and a first pull-down transistor Trpud1. The carry output portion 173b can include a second pull-up transistor Trpu2 and a second pull-down transistor Trpud2.

The gate output portion 173a outputs the high gate voltage VGH (i.e., the gate drive voltage or a gate signal) through a gate output terminal, using the clock signal CLK and the control signals from the controller 172. Also, the gate output portion 173a can applies the high gate voltage VGH to a gate line connected with the respective stage. The high gate voltage VGH can be selectively generated according to the control signals at inverting and non-inverting nodes Q and /Q within the respective stage, and directly applied to the gate line connected with the respective stage.

The carry output portion 173b outputs the carry signal through a carry output terminal, using the clock signal CLK and the control signals from the controller 172. Also, the carry output portion 173b can allows the carry signal to be applied from the respective stage, which is connected to the nth gate line GLn, to the discharge circuit (i.e., the discharge transistor) connected to the (n−3)th gate line GLn−3. As such, the discharge circuit (i.e., the discharge transistor) connected to the (n−3)th gate line GLn−3 can be activated.

The carry signal is controlled by the control signals at the inverting and non-inverting nodes Q and /Q. As such, the carry signal can have the same waveform as the high gate voltage being output through the gate output terminal. Also, the carry signal can directly control the discharge circuit connected with a different gate line, without being applied to any gate line. In accordance therewith, the discharge circuit can be driven without any initial delay. As a result, the high gate voltage VGH charged in each gate line can be rapidly discharged to the low gate voltage VGL without being delayed.

As shown in FIG. 5, a signal output from the gate output terminal of the kth stage is smoothly delayed in an interval transitioning from a low level to a high level, but falls rapidly in another interval transitioning from the high level to the low level. In other words, the gate drive voltage according to the present embodiment can have an enhanced delay characteristic compared to that of the related art depicted by a dotted line.

This results from the fact that a kth discharge circuit connected with a kth gate line GLk is driven by a carry signal CS from a (k+3)th stage connected with a (k+3)th gate line GLk+3 and enables the high gate voltage VGH on the kth gate line GLk to be rapidly discharged.

If the carry signal and the high gate voltage VGH generated in the same stage are not separated from each other, the high gate voltage VGH is used to activate the discharge circuit. In this case, the gate drive voltage rises to the high gate voltage VGH with having an initial delay, like the kth Gate signal shown in FIG. 5. As such, the turning-on/off of the discharge circuit is delayed by the initial delay value. Due to this, the high gate voltage VGH on the kth gate line GLk cannot be rapidly discharged.

In order to control the discharge circuit connected with each gate line, each stage of the present embodiment includes a carry output terminal not connected with any gate line and directly applies the carry signal to the discharge circuit via the carry output terminal. As such, the high gate voltage VGH on each gate line GL1~GLn can be rapidly discharged.

Figure 6:
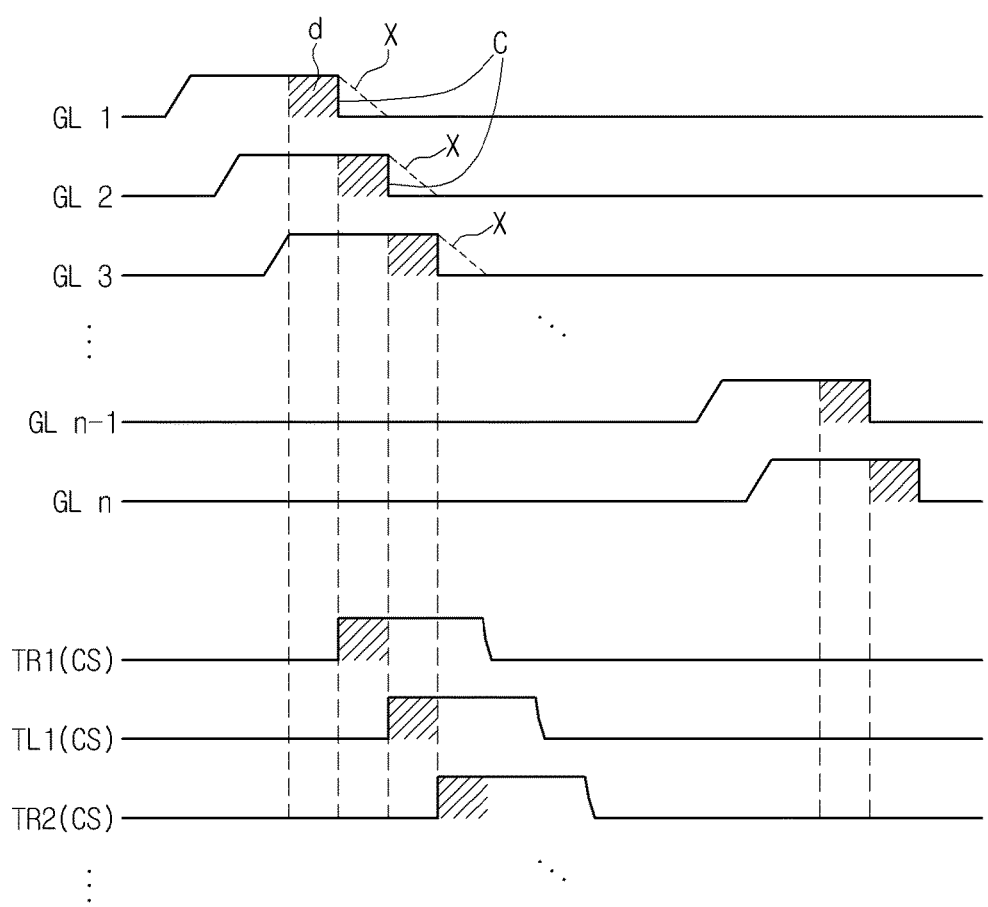
FIG. 6 is a waveform diagram illustrating variations of gate drive voltages, which are applied to gate lines on an LCD panel, in accordance with a first embodiment of the present disclosure.

FIG. 6 is a waveform diagram illustrating variations of gate drive voltages, which are applied to gate lines on an LCD panel, in accordance with a first embodiment of the present disclosure.

Referring to FIGS. 6 and 3, the LCD device with the discharge circuits according to a first embodiment of the present disclosure enables not only each gate line GL1~GLn to be charged with the high gate voltage VGH during the period of three horizontal synchronous cycles, and then the voltage charged in each gate line to be discharged to the low gate voltage VGL. The high gate voltages VGH on the two gate lines adjacent to each other overlap with each other by the period of two horizontal synchronous cycles. Also, the high gate voltages VGH on the gate lines connected to the same gate driver 140a or 140b overlap with each other by the period of a single horizontal synchronous cycle. The data voltages "d" are applied the pixels during a single horizontal synchronous period of the overlap period between the high gate voltages VGH on the gate lines GL1~GLn.

Particularly, as shown in the drawings, when the voltage on each gate line is discharged, the low gate voltage VGL is applied to both end of the respective gate line. As such, the voltage on each gate line falls into the low gate voltage VGL with having a sharp falling edge "c".

As shown in FIG. 3, the present embodiment allows the first right discharge transistor connected with the first gate line GL1 to be turned-on by the carry signal CS generated in the second right stage STR2 which is connected to the fourth gate line GL4. As such, the voltage on the first gate line GL1 promptly transitions from the high gate voltage VGH to the low gate voltage VGL without any delay. Meanwhile, if the first right discharge transistor TR1 is turned-on by the high gate voltage will being applied to the fourth gate line GL4 as illustrated by dotted lines "x", a delay problem is generated when the voltage on the first gate line GL1 transitions from the high gate voltage VGH to the low gate voltage VGL.

Moreover, as seen from FIG. 6, it is evident that the anterior portions of the carry signals used to control the discharge circuits (i.e., the left and right discharge transistors), which are arranged adjacently to the first and second gate drivers 140a and 140b, each have a very ideal transition from the low gate voltage VGL to the high gate voltage VGH, unlike that of the gate drive voltage.

In accordance therewith, the discharge transistors connected with the respective gate lines GL1~GLn can be rapidly turned-on/off by the carry signals applied from the respective stages. Therefore, the high gate voltage VGH charged in each gate line can be promptly discharged without any delay.

Figure 7:
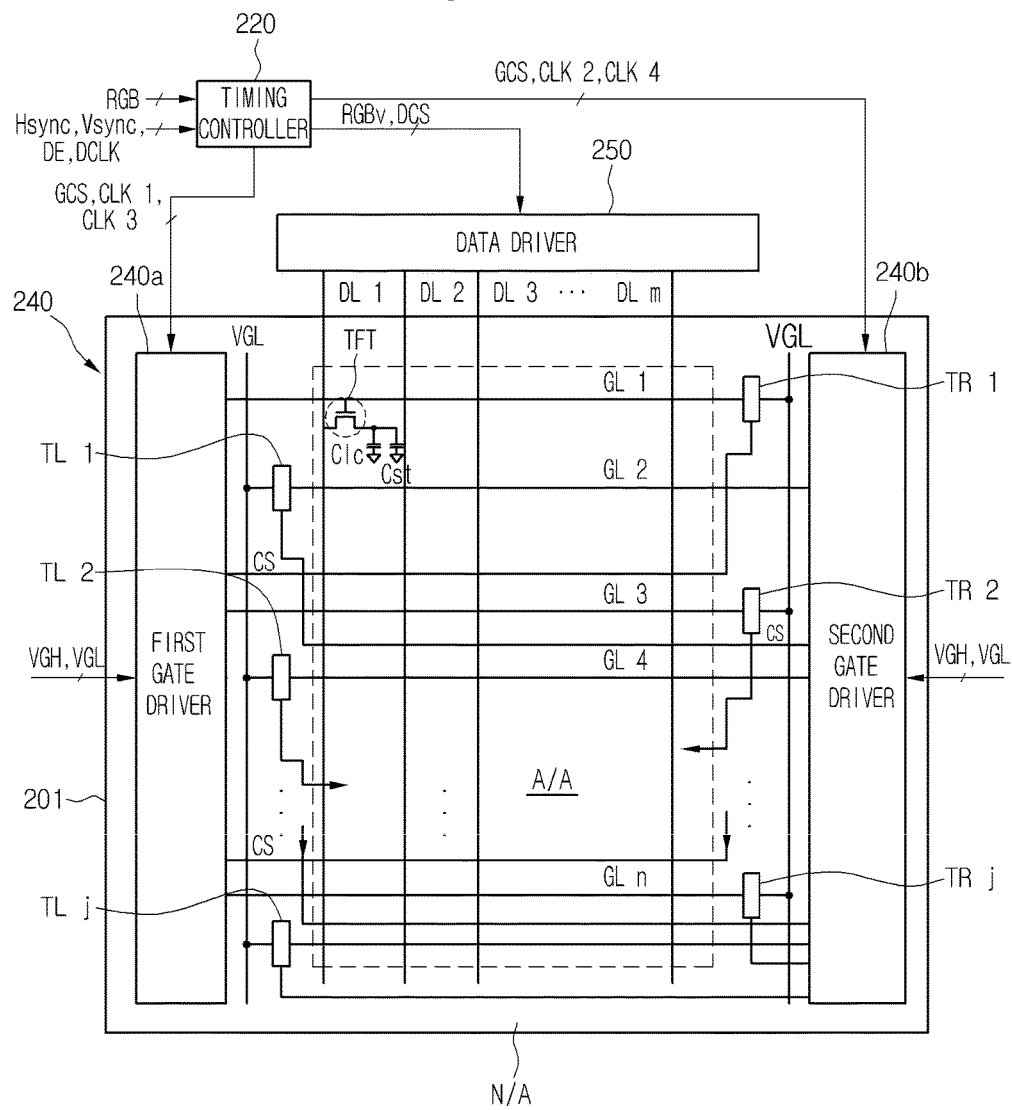
FIG. 7 is a block diagram showing an LCD device according to a second embodiment of the present disclosure.

FIG. 7 is a block diagram showing an LCD device according to a second embodiment of the present disclosure.

The LCD device 100 according to a second embodiment of the present disclosure uses four phase clock signals CLK1~CLK4 in order to provide a more stable operation compared to a 120 Hz drive mode. The configuration of each stage within the gate driver, which is disclosed in the first embodiment, can be applied to the second embodiment in the same manner. As such, the description of the second embodiment will be focused on components of the second embodiment which are distinguished from those of the first embodiment.

The LCD device according to a second embodiment of the present disclosure includes an LCD panel 201 configured to display images, a timing controller 220 configured to generate a variety of control signals using timing signals applied from external system, and gate and data drivers 240 and 250 configured to control the LCD panel 201 in response to the control signals.

The timing controller 220 generates a plurality of clock signals, for example, first through fourth clock signals CLK1~CLK4 used to determine a driving timing of each stage within the gate driver 240. The first through fourth clock signals CLK1~CLK4 each have a high level interval (or width) corresponding to two horizontal synchronous cycles (or periods). The high level intervals (or widths) of first through fourth clock signals CLK1~CLK4 overlap with one another by the period of a single horizontal synchronous cycle.

The gate driver 240 includes the first and second gate drivers 240a and 240b which are disposed on both edges of the LCD panel 201 corresponding to the non-display area N/A. The first and second gate drivers 240a and 240b each include a shift register which consists of a plurality of stages.

The first and second gate driver 240 (240a and 240b) reply to the gate control signals GCS applied from the timing controller 122 and perform alternately with each other the output operation of a gate drive voltage every single horizontal synchronous cycle, so that the gate drive voltages are sequentially applied to the plurality of gate lines GL1~GLn on the LCD panel 101 in a single horizontal synchronous cycle. The gate drive voltage applied to each gate line GL maintains a high gate voltage VGH during the period of two horizontal synchronous cycles. Also, the high gate voltage interval (or width) of the gate drive voltage applied to each gate line overlaps with those of the gate drive voltages applied the previous and next gate lines GL adjacent to the respective gate line by the period of a single horizontal synchronous cycle. This results in pre-charging of the gate lines GL1~GLn. As such, the pixel can perform a more stable charging operation when the data voltage is applied.

To this end, the first and third clock signals CLK1 and CLK3 each having a pulse width corresponding to two horizontal synchronous cycles (i.e., a period corresponding to four horizontal synchronous cycles) are applied to the first gate driver 240a. Also, the second and fourth clock signals CLK2 and CLK4 having the same pulse width as the first and third clock signals CLK1 and CLK3 are applied to the second gate driver 140b. The second and fourth clock signals CLK2 and CLK4 overlap with the first and third clock signals CLK1 and CLK3 by the period corresponding to a single horizontal synchronous cycle, respectively.

For example, the high gate voltage VGH is applied from the second gate driver 240b to the (k+1)th gate line GLk+1 after the period of a single horizontal cycle from when the high gate voltage VGH is applied from the first gate driver 240a to the kth gate line GLk. After the period of a single horizontal synchronous cycle from when the high gate voltage VGH is applied from the second gate driver 240b to the (k+1)th gate line GLk+1, not only the high gate voltage VGH is applied from the first gate driver 240a to the (k+2)th gate line GLk+2 but also the low gate voltage VGL is applied from the first gate driver 240a to the kth gate line GLk. As such, the thin film transistors TFT on the kth gate line GLk are turned-off and allow the data voltages charged into the liquid crystal cell Clc to be maintained during a single frame period. Wherein "k" is a natural number smaller than "n". Also, after the period of a single horizontal synchronous cycle, the second gate driver 240b performs for the (k+3)th and the (k+1)th gate lines GLk+3 and GLk+1 the same operation as the first gate driver 240a. In this manner, the gate lines GL1~GLn can be sequentially enabled by the first and second gate drivers 240a and 240b being driven alternately with each other. The details related to this will be, or will become, apparent to one with skill in the art upon the above description of the first embodiment.

Also, the LCD device can further includes discharge circuits TL1~TLj and TR1~TRj, in order to minimize the discharge delay of the gate drive voltage when the voltage on each gate line transitions from the high gate voltage VGH into the low gate voltage VGL. The discharge circuits TL1~TLj and TR1~TRj can be connected to one ends of the respective gate lines. The discharge circuits includes left discharge circuits TL1~TLj and right discharge circuits TR1~TRj. Wherein "j" is a natural number smaller than "n". The left discharge circuits TL1~TLj arranged adjacently to the first gate driver 240a are connected to even-numbered gate lines GL2, GL4, . . . , GLn. The right discharge circuits TR1~TRj arranged adjacently to the second gate driver 240b are connected to odd-numbered gate lines GL1, GL3, . . . , GLn−1.

The LCD device of the second embodiment allows each stage of the gate driver 240 to include a gate output terminal and a carry output terminal configured to output a carry signal CS, as shown in FIGS. 4A and 4B. Also, the LCD device of the second embodiment enables each of the discharge circuits TL1~TLj and TR1~TRj to be controlled by the carry signal CS without having any initial delay.

Figure 8:
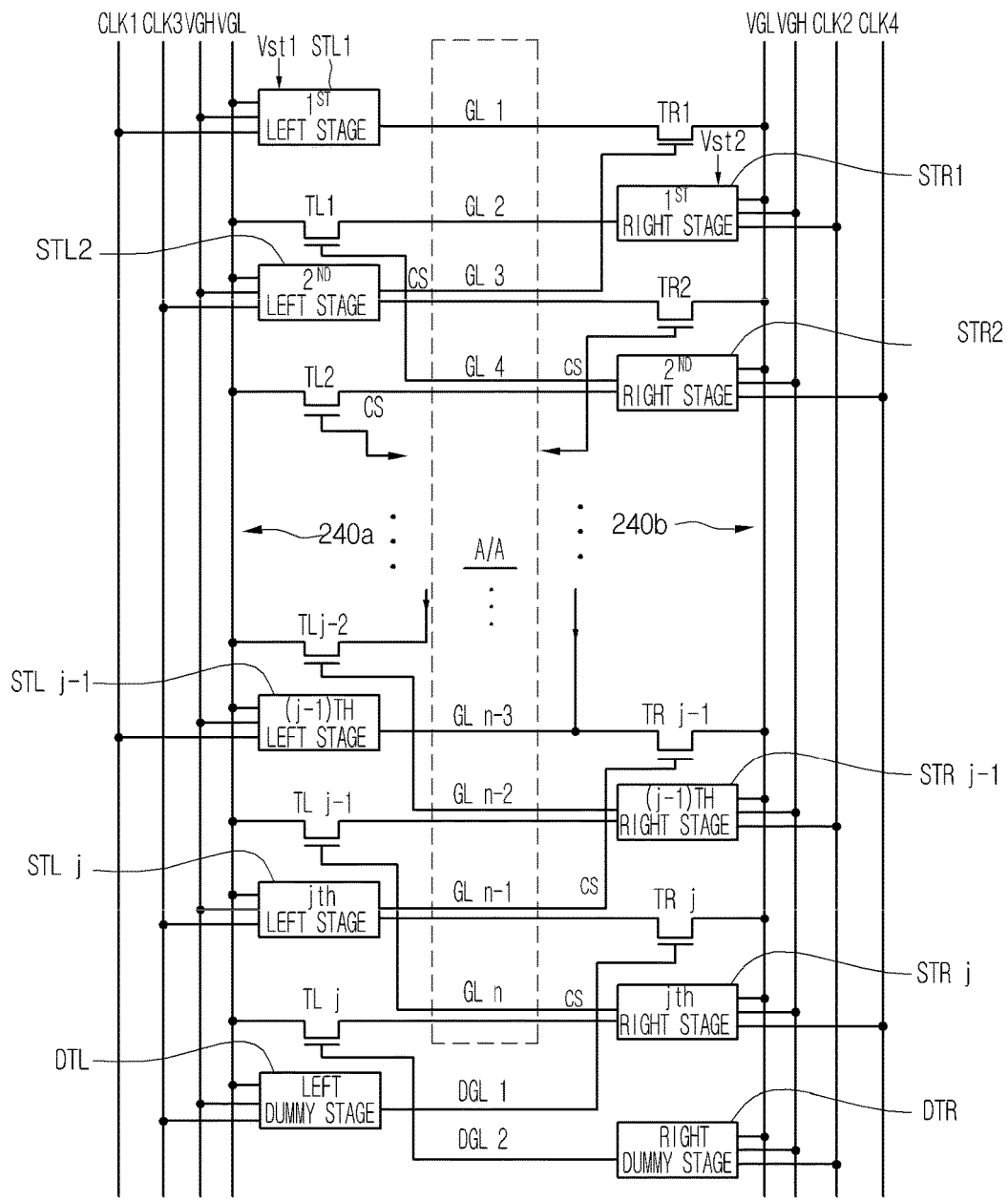
FIG. 8 is a detailed circuit diagram showing the configuration of a gate driver, which includes discharge circuits and is formed on an LCD panel, according to a second embodiment of the present disclosure.

FIG. 8 is a detailed circuit diagram showing the configuration of a gate driver and discharge circuits, which are formed on an LCD panel, according to a second embodiment of the present disclosure.

Referring to FIG. 8, the gate driver 240 according to a second embodiment of the present disclosure includes the first gate driver 240 formed on one edge of the LCD panel 201 and the second gate driver 240b formed another edge opposite to one edge. Meanwhile, each of the discharge circuits can be implemented by a single discharge transistor. As such, the gate driver further includes a plurality of left discharge transistor disposed between stages of the first gate driver 240a and a plurality of right discharge transistors TR1~TRj disposed between stages of the second gate driver 240b.

The stages can be driven in a four phase mode. To this end, first through fourth clock signals CLK1~GLK4 with four phases different from one another, a high gate voltage VGH, a carry signal CS generated in other stage and a low gate voltage VGL are applied to the stages. Although they are not shown in the drawings, a power supply voltage VDD and a ground voltage GND can be applied to the stages. The first through fourth clock signals CLK1~CLK4 each have a high level interval (or width) corresponding to two horizontal synchronous cycles. The high level intervals (or widths) of the first through fourth clock signals CLK1~CLK4 overlap with one another by the period of a single horizontal synchronous cycle.

Also, the stages within the gate driver 240 of the second embodiment each include an output portion configured to output a gate drive voltage (i.e., the high gate voltage pulse) and a carry signal which will be applied to a discharge circuit connected to an adjacent gate line as shown in FIG. 4A, unlike those of the related art gate driver. The output portion of each stage can include a gate output portion configured to output the gate drive voltage and a carry output portion configured to output the carry signal, as shown in FIG. 4B.

More specifically, the first gate driver 240a receives the first and third clock signals CLK1 and CLK3, the high gate voltage VGH, the carry signal CS and the low gate voltage VGL. The first gate driver 240a replies to a first start voltage Vst1 corresponding to a gate start pulse GSP and sequentially outputs the gate drive voltages to a plurality of odd-numbered gate lines GL1, GL3, . . . , GLn−1 in the period of two horizontal synchronous cycles. The gate drive voltages each have a high gate voltage pulse which is used to turn-on the thin film transistors within the display area A/A and has a width corresponding to two horizontal synchronous cycles. The high gate voltage pulse applied to each gate line overlaps with the high gate voltage pulses, which are applied to the previous and next gate lines adjacent to the respective gate line, by the period of a single horizontal synchronous cycle.

Such a first gate driver 240a includes first through jth left stages STL1~STLj and a left dummy stage DTL which are serially connected to one another lased on the first start voltage Vst1.

The second gate driver 240b receives the second and fourth clock signals CLK2 and CLK4, the high gate voltage VGH, the carry signal CS and the low gate voltage VGL. The second gate driver 240b replies to a second start voltage Vst2 corresponding to the gate start pulse GSP and sequentially outputs the gate drive voltages to a plurality of even-numbered gate lines GL2, GL4, . . . , GLn in the period of two horizontal synchronous cycles. The gate drive voltages on the even-numbered gate lines GL2, GL4, . . . , GLn have the similar high gate voltage pulses to those on the odd-numbered gate lines GL1, GL3, . . . , GLn−1.

This second gate driver 240b includes first through jth right stages STR1~STRj and a right dummy stage DTR which are serially connected to one another based on the second start voltage Vst2.

Also, the gate driver 240 includes left discharge transistors TL1~TLj disposed between the left stages which include the first through jth left stages STL1~STLj and the left dummy stages DTL.

A first electrode of each left discharge transistor TL1~TLj is connected to the even-numbered gate line GL2, GL4, . . . , GLn to which the gate output portion (or terminal) of each right stage STR1~STRj or the gate output portion (or terminal) of the left dummy stage DTL is connected. A gate electrode of each left discharge transistor TL1~TLj is connected to the carry output portion (or terminal) of either the posterior right state to the right stage STR which is connected to the first electrode, or the right dummy stage DTR. A second electrode of each left discharge transistor TL1~TLj is connected to a low gate voltage line used to transfer the low gate voltage VGL.

For example, the first electrode of the first left discharge transistor TL1 is connected to the second gate line GL2, and the gate electrode of the first left discharge transistor TL1 is connected to the carry output portion (or terminal) of the second right stage STR2 connected to the fourth gate line GL4. Also, the second electrode of the first left discharge transistor TL1 is connected to the low gate voltage line.

The gate driver 240 further includes right discharge transistors TR1~TRj disposed between the right stages which include the first through jth right stages STR1~STRj and the right dummy stage DTR.

A first electrode of each right discharge transistor TR1~TRj is connected to the odd-numbered gate line GL1, GL3, . . . , GLn to which the gate output portion (or terminal) of each left stage STL1~STLj is connected. A gate electrode of each right discharge transistor TR1~TRj is connected to the carry output portion (or terminal) of either the posterior left state to the left stage STL which is connected to the first electrode, or the left dummy stage DTL. A second electrode of each right discharge transistor TR1~TRj is connected to a low gate voltage line used to transfer the low gate voltage VGL.

For example, the first electrode of the first right discharge transistor TR1 is connected to the first gate line GL1, and the gate electrode of the first right discharge transistor TR1 is connected to the carry output portion (or terminal) within the second right stage STR2 for applying the gate drive voltage to the third gate line GL3. Also, the second electrode of the first right discharge transistor TR1 is connected to the low gate voltage line.

Such an LCD device of the second embodiment can performs the same operation as that of the first embodiment, but drives the gate driver 240 using the four phase clock signals CLK1~CLK4. Also, the LCD device of the second embodiment enables the first right discharge transistor TR1 connected with the first gate line GL1 to be turned-on by the carry signal of the second left stage STL2 disposed opposite to the first right discharge transistor TR1. Similarly, the first left discharge transistor TL1 connected to the second gate line GL2 is turned-on by the carry signal of the second right stage STR2 disposed opposite to the first left discharge transistor TL1.

In other words, the discharge circuit TL1~TLj and TR1~TRj connected to each gate line GL1~GLn is controlled by the carry signal CS independently output from each stage, instead of the gate drive voltage (i.e., the high gate voltage VGH). As such, the discharge delay of the gate drive voltage (i.e., the high gate voltage VGH) on each gate line can be minimized.

FIG. 9 is a waveform diagram illustrating variations of gate drive voltages, which are applied to gate lines on an LCD panel, in accordance with a second embodiment of the present disclosure.

Referring to FIGS. 8 and 9, the LCD device with the discharge circuits according to a second embodiment of the present disclosure enables not only each gate line GL1~GLn to be charged with the high gate voltage VGH during the period of two horizontal synchronous cycles, and then the voltage charged in each gate line to be discharged to the low gate voltage VGL. The high gate voltages VGH on the two gate lines adjacent to each other overlap with each other by the period of a single horizontal synchronous cycle. However, the high gate voltages VGH on the gate lines connected to the same gate driver 240a or 240b do not overlap with one another in time. The data voltages "d" are applied the pixels during a single horizontal synchronous period of the overlap period between the high gate voltages VGH on the gate lines GL1~GLn.

Particularly, as shown in the drawings, when the voltage on each gate line is discharged, the low gate voltage VGL is applied to both end of the respective gate line. As such, the voltage on each gate line falls into the low gate voltage VGL with having a sharp falling edge "F".

As shown in FIG. 8, the second embodiment allows the first right discharge transistor TR1 connected with the first gate line GL1 to be turned-on by the carry signal CS generated in the second left stage STL2 which is connected to the third gate line GL3. As such, the voltage on the first gate line GL1 promptly transitions from the high gate voltage VON to the low gate voltage VGL without any delay. Meanwhile, if the first right discharge transistor TR1 is turned-on by the high gate voltage VON being applied to the third gate line GL3, as illustrated by dotted lines "Y", a delay problem is generated when the voltage on the first gate line GL1 transitions from the high gate voltage VON to the low gate voltage VGL.

Moreover, as seen from FIG. 9, it is evident that the anterior portions of the carry signals used to control the discharge circuits (i.e., the left and right discharge transistors), which are arranged adjacently to the first and second gate drivers 240a and 240b, each have a very ideal transition from the low gate voltage VGL to the high gate voltage VGH, unlike that of the gate drive voltage.

In accordance therewith, the discharge transistors connected with the respective gate lines GL1~GLn can be rapidly turned-on/off by the carry signals applied from the respective stages. Therefore, the high gate voltage VGH charged in each gate line can be promptly discharged without any delay.

The LCD device according to embodiments of the present disclosure disposes discharge circuits on gate line and rapidly discharges a gate drive voltage charged in each gate line. As such, enhance image quality can be enhanced.

Also, the LCD device according to embodiments of the present disclosure enables a gate drive voltage and a carry signal for controlling a discharge circuit disposed on an anterior gate line to be independently output from each stage within a gate driver. In accordance therewith, a discharge delay of the gate drive voltage can be prevented.

Moreover, LCD device according to embodiments of the present disclosure provides a dual GIP mode LCD panel with two gate drivers configured to perform for gate drive voltages an alternate output instead of a simultaneous output. Therefore, the number of stages can decrease, and furthermore the occupying area of a gate driver can be reduced.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. A liquid crystal display device comprising:
   a liquid crystal display panel in which a plurality of gate lines are formed;
   a controller configured to generate at least four clock signals with difference phases, wherein at least one clock signal among the at least four clock signals overlaps with another one of the at least four clock signals by at least one period of a horizontal synchronous cycle;
   a first gate driver configured to apply a high gate voltage to (2k−1)th gate line in response to at least two of the clock signals from the controller, the 'k' being a natural number greater than zero;
   a second gate driver configured to apply the high gate voltage to (2k)th gate line in response to the others of the clock signals from the controller, wherein the first gate driver and the second gate driver are disposed at opposite edges of the liquid crystal display panel;
   left discharge circuits each configured to apply a low gate voltage to the (2k)th gate line in response to a carry signal opposite to a voltage level on (2k+2)th gate line; and
   right discharge circuits each configured to apply the low gate voltage to the (2k−1)th gate line in response to the carry signal opposite to the voltage level on (2k+1)th gate line,
   wherein the first gate driver includes a plurality of left stages having a left stage including a gate output portion to output the high gate voltage to the (2k+1)th gate line and a carry output portion to output the carry signal to a right discharge circuit connected to the (2k−1)th gate line,
   wherein the second gate driver includes a plurality of right stages having a right stage including a gate output portion to output the high gate voltage to the (2k+2)th gate line and a carry output portion to output the carry signal to a left discharge circuit connected to the (2k)th gate line,
   wherein the gate output portion and the carry output portion of each of the plurality of left and right stages are separated from each other, and the carry output portion of each of the plurality of left and right stages is not connected to any of the plurality of gate lines, and
   wherein opposite ends of each gate line among the plurality of gate lines are configured to simultaneously receive a low voltage from a corresponding stage among the plurality of left stages and the plurality of right stages and a low voltage from a corresponding discharge circuit among left and right discharge circuits.

2. The liquid crystal display device of claim 1, wherein the at least fourth clock signals include first through fourth clock signals which have, high intervals which each correspond to two horizontal synchronous cycles and overlap with one another by a period of a single horizontal synchronous cycle.

3. The liquid crystal display device of claim 2, wherein the first gate driver receives the first and third clock signals from the controller, and the second gate driver receives the second and fourth clock signals from the controller.

4. The liquid crystal display device of claim 1, wherein the first gate driver further includes a left dummy stage connected to at least one of the right discharge circuits, and the second gate driver further includes a right dummy stage connected to at least one of the left discharge circuits.

5. The liquid crystal display device of claim 1, wherein the left discharge circuits each include a transistor which includes:
   a first electrode connected to the (2k)th gate line;
   a second electrode configured to receive the low gate voltage; and
   a gate electrode connected to the carry output portion opposite to the (2k+2)th gate line.

6. The liquid crystal display device of claim 1, wherein the right discharge circuits each include a transistor which includes:

a first electrode connected to the (2k−1)th gate line;
a second electrode configured to receive the low gate voltage; and
a gate electrode connected to the carry output portion opposite to the (2k+1)th gate line.

\* \* \* \* \*